United States Patent
Gazsi et al.

(10) Patent No.: US 9,360,503 B2
(45) Date of Patent: Jun. 7, 2016

(54) METHOD FOR DETERMINING A SAMPLING TIME OF A SIGNAL, DEVICE FOR DETERMINING THE SAME, AND METHOD FOR DETERMINING A SAMPLING PARAMETER OF A SIGNAL

(71) Applicant: Intel Mobile Communications GmbH, Neubiberg (DE)

(72) Inventors: Lajos Gazsi, Duesseldorf (DE); Stefan Meier, Neubiberg (DE); Matthias Schoebinger, Munich (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 359 days.

(21) Appl. No.: 13/961,990

(22) Filed: Aug. 8, 2013

(65) Prior Publication Data
US 2015/0042310 A1 Feb. 12, 2015

(51) Int. Cl.
*G01R 29/00* (2006.01)
*G01R 13/02* (2006.01)
*G04D 7/00* (2006.01)

(52) U.S. Cl.
CPC ............ *G01R 13/0272* (2013.01); *G01R 29/00* (2013.01); *G04D 7/003* (2013.01)

(58) Field of Classification Search
CPC ..... G01R 29/00; G01R 13/0272; G04D 7/003
See application file for complete search history.

(56) References Cited

U.S. PATENT DOCUMENTS

| 4,989,221 | A | * | 1/1991 | Qureshi | ............. | H03H 17/0621 370/290 |
| 5,267,335 | A | * | 11/1993 | Mita | ......................... | G06K 9/60 250/208.1 |
| 5,281,909 | A | * | 1/1994 | Brust | .................... | G01R 31/305 324/754.22 |
| 5,500,613 | A | * | 3/1996 | Gazsi | ......................... | G06F 1/02 327/107 |
| 2003/0053234 | A1 | * | 3/2003 | Patapoutian | ............. | G11B 5/09 360/29 |
| 2005/0238124 | A1 | * | 10/2005 | Becker | ................. | H04B 1/7085 375/350 |
| 2011/0082656 | A1 | * | 4/2011 | Todorokihara | ......... | G01R 23/10 702/78 |
| 2011/0282625 | A1 | * | 11/2011 | Craninckx | ............ | G04F 10/005 702/178 |

OTHER PUBLICATIONS

F. Baronti, D. Lunardini, R. Roncella, and R. Saletti, "Picosecond-accuracy digital-to-time converter for phase-interpolation DDS"; 35th Annual Precise Time and Time Interval (PTTI) Meeting (2003); pp. 347-358.

G. Nagaraj, S. Miller, B. Stengel, G. Cafaro, T. Gradishar, S. Olson, R. Hekmann, "A Self-Calibrating Sub-Picosecond Resolution Digital-to-Time Converter"; Microwave Symposium (2007); pp. 2201-2204.

(Continued)

*Primary Examiner* — Jeff Natalini

(57) ABSTRACT

A method for determining a sampling time of a signal, the method including: determining a candidate sampling time of a signal for input to a sampling circuit; determining a resultant sampling time at which the sampling circuit samples the signal when input with the candidate sampling time; and determining a sampling time of the signal based on a noise shaping of a difference between the resultant sampling time and the candidate sampling time.

20 Claims, 13 Drawing Sheets

(56) References Cited

OTHER PUBLICATIONS

S. Talwalkar, T. Gradishar, B. Stengel, G. Cafaro, and G. Nagaraj, "Controlled Dither in 90 nm Digital to Time Conversion Based Direct Digital Synthesizer for Spur Mitigation"; RF IC symposium 2010; pp. 549-552.

M. Z. Straayer, M. H. Perrot, "A multi-path gated ring oscillator TDC with first-order noise shaping"; IEEE J. Solid-State Circuits 44(4):1089-1098(2009).

Y. Cao, P. Leroux, W. De Cock, M. Steyaert, "A 1.7mW 11b 1-1-1 MASH SD time-to-digital converter"; IEEE ISSCC 480-481(2011).

P. Madoglio et al. "A 20dBm 2.4GHz Digital Outphasing Transmitter for WLAN Application in 32nm CMOS"; IEEE ISSCC 168-170 (2012).

(Matthew Z. Straayer, Student Member, IEEE, and Michael H. Perrott, Member, IEEE), "A 12-Bit, 10-MHz Bandwidth, Continuous-Time SD ADC With a 5-Bit, 950-MS/s VCO-Based Quantizer", IEEE Journal of Solid-State Circuits, Vol. 43, No. 4, Apr. 2008.

* cited by examiner

1300

Determine candidate sampling parameter of signal — 1302

Determine sampling parameter error introduced by circuit — 1304

Determine, based on sampling parameter error, resultant sampling parameter resulting from candidate sampling parameter — 1306

Determine sampling parameter of signal based on noise shaping of difference between resultant sampling parameter and candidate sampling parameter of signal — 1308

FIG. 13

METHOD FOR DETERMINING A SAMPLING TIME OF A SIGNAL, DEVICE FOR DETERMINING THE SAME, AND METHOD FOR DETERMINING A SAMPLING PARAMETER OF A SIGNAL

TECHNICAL FIELD

Various aspects relate to a method for determining a sampling time of a signal, a device for determining the same, and a method for determining a sampling parameter of a signal.

BACKGROUND

Replacement of analog circuit components such as NCOs (numerically controlled oscillators) and/or PLLs (phase-locked-loop) with digital circuits (e.g. digital logic circuits) may be an area of interest in various applications, e.g. in RF (radio frequency) systems.

Whilst digital circuits have been decreasing in size, analog circuit components have not followed digital circuits in their shrink-factor. Furthermore, functionalities provided by digital circuits have improved at a greater pace than have analog circuit components. Accordingly, it may be desirable to investigate circuit arrangements that may include replacement of analog circuit blocks with digital blocks having small form factors and/or enhanced functionality. For example, currently used NCOs may have technical limitations in its frequency-range and modulation bandwidth, which could be resolved by means of digital circuits. Besides enhanced functionality, replacement of some analog circuit blocks with digital blocks may yield a mixed-signal circuit that may be enable multi-signal sourcing (namely, using both analog and digital signals) and easy migration to future technology nodes with close to digital shrink factors. Even further, digital implementations may allow reproducibility and potential for extra functionality, which may not be realized in the analog domain. Examples include digital assisted calibration and/or digital adjustments for yield improvements.

Whilst replacement of some analog circuit with digital circuits may be desirable, a challenge for mixed-signal implementations (e.g. in RF applications) may be compliance with stringent requirements regarding the circuit's noise levels and SFDR (spurious-free dynamic range), especially in light of future technology nodes. It may be desirable to provide new circuits that may meet requirements for noise level and SFDR.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 13 shows a method for determining a sampling parameter of a signal.

DESCRIPTION

Figure 1:
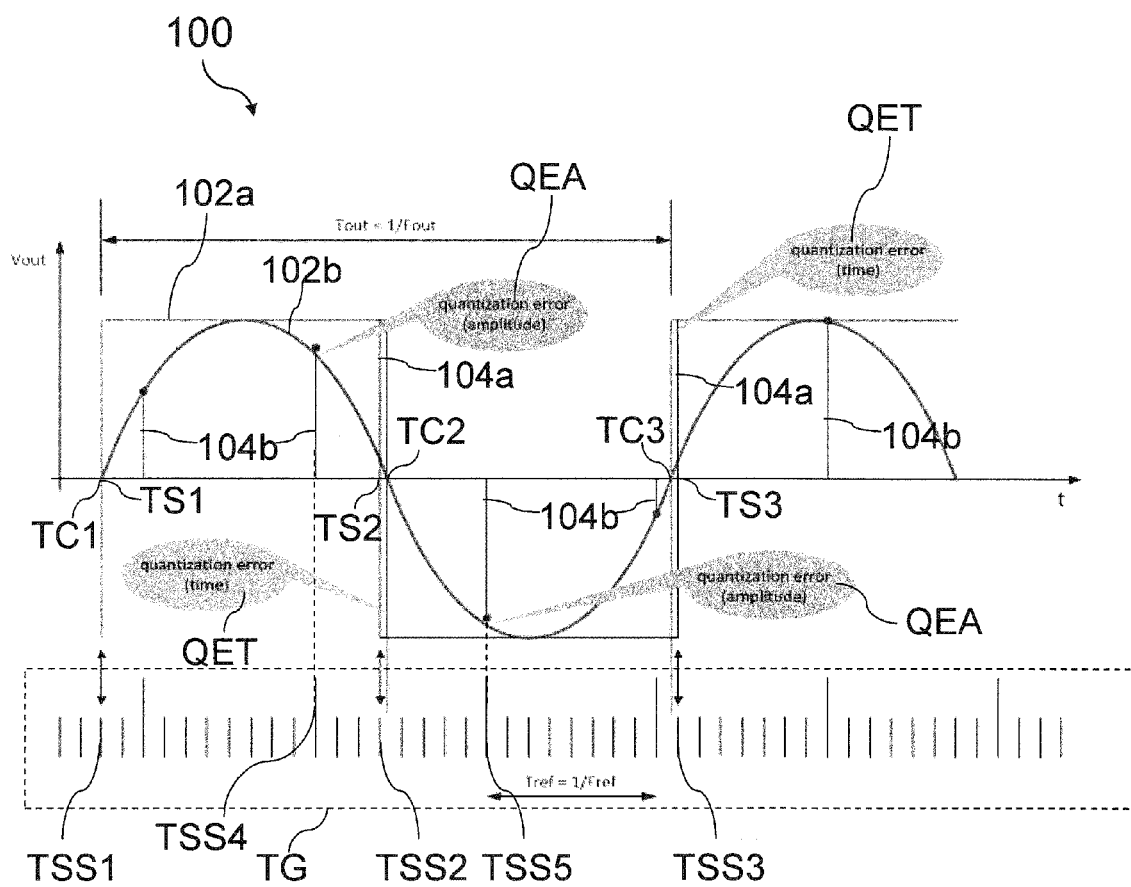
FIG. 1 shows a view of a signal, a grid of uniformly spaced sampling times, and a quantized signal.

The following detailed description refers to the accompanying drawings that show, by way of illustration, specific details and aspects in which the invention may be practised. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described for structures or devices, and various aspects are described for methods. It may be understood that one or more (e.g. all) aspects described in connection with structures or devices may be equally applicable to the methods, and vice versa.

The word "exemplary" is used herein to mean "serving as an example, instance, or illustration". Any aspect or design described herein as "exemplary" is not necessarily to be construed as preferred or advantageous over other aspects or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

Replacement of analog circuit components such as NCOs (numerically controlled oscillators) and/or PLLs (phase-locked-loop) with digital circuits (e.g. digital logic circuits) may be an area of interest in various applications, e.g. in RF (radio frequency) systems. Currently used NCOs may have technical limitations in its frequency-range and modulation bandwidth, which could be resolved by means of digital circuits.

For example, in an RF system (e.g. in an RF transmitter, e.g. a polar RF transmitter), a carrier signal may be generated and/or modulated by means of a digital circuit. For example, a direct digital synthesis of arbitrary frequencies (DDFS) and/or a direct digital modulation (DDM) of the carrier signal may be performed. By way of another example, carrier signal generation and/or modulation by means of a digital circuit may include DDPS (Direct Digital Period Synthesis), which may be configured to generate a carrier signal, and DTC (Digital to Time Convertor), which may be configured to modulate a phase of a carrier signal (e.g. an existing carrier signal).

FIG. 1 shows a view 100 of a signal 102a, 102b, a grid of uniformly spaced sampling times TG, and a quantized signal 104a, 104b.

As shown in FIG. 1, the signal 102a, 102b may include, or may be, a square wave signal 102a (e.g. a rectangular signal) and/or a sinusoidal signal 102b. The signal 102a, 102b (e.g. square wave signal 102a and/or sinusoidal signal 102b) may include, or may be, a carrier signal. The signal 102a, 102b may have a frequency (e.g. a fundamental frequency) $f_{OUT}$.

As described above, DDPS may be configured to generate a carrier signal and DTC may be configured to modulate a phase of the carrier signal. In some applications that may use DDPS and/or DTC, a square wave signal 102a (e.g. a rectangular signal) may be generated as the carrier signal and/or modulated instead of the sinusoidal signal 102b that may normally be used to represent a carrier signal. For example, generating a square wave 102a (e.g. a rectangular signal) as the carrier signal may be justified since harmonics (e.g. frequencies $3*f_{OUT}$, $5*f_{OUT}$, $7*f_{OUT}$, etc.) may be attenuated sufficiently by following stages such as a mixer, a duplexer, an amplifier (e.g. a power amplifier) and/or an impedence matching circuit (e.g. a 50 Ohm impedance matching circuit. However, in other applications that may use DDPS and/or DTC, either one of the square wave signal 102a or the sinusoidal signal 102b may be generated as the carrier signal and/or subsequently modulated.

As shown in FIG. 1, candidate sampling times TC1, TC2, TC3 may be defined for the signal 102a, 102b. Only three candidate sampling times TC1, TC2, TC3 are shown as an example, however the number of sampling times of the signal 102a, 102b may be less than three (e.g. one, two) or may be more than three, e.g. four, five, six, seven, eight, nine, tens, or hundreds sampling times.

The candidate sampling times TC1, TC2, TC3 may include, or may be, a time of a zero-crossing of the signal 102a, 102b. For example, as shown in FIG. 1, the zero-crossings of the square wave signal 102a may occur at times indicated by the candidate sampling times TC1, TC2, TC3. By way of another example, the zero-crossings of the sinusoidal wave signal 102b may occur at times indicated by the candidate sampling times TC1, TC2, TC3.

The candidate sampling times TC1, TC2, TC3 of the signal 102a, 102b may include, or may be, a time the signal 102a, 102b changes from a first value a second value. For example, as shown in FIG. 1, the candidate sampling times TC1, TC2, TC3 of the signal 102a, 102b may include, or may be, a time the signal 102a, 102b changes from a positive value to a negative value, or vice versa.

The candidate sampling times TC1, TC2, TC3 of the signal 102a, 102b may include, or may be, a time of a rising edge or falling edge of the signal 102a, 102b. For example, as shown in FIG. 1, the square wave signal 102a may have a rising edge or a falling edge that may occur at the candidate sampling times TC1, TC2, TC3.

In an example where the carrier signal generated may be the square wave signal 102a, the task of DDFS and/or DDM may be visualized as a selection of sampling times TS1, TS2, TS3 of the square wave 102a, as shown in FIG. 1. The sampling times TS1, TS2, TS3 of the square wave 102a may be selected from sampling times of a grid of uniformly spaced sampling times TG. The grid of uniformly spaced sampling times TG may include a sampling times TSS1, TSS2, TSS3, TSS4, TSS5 of a sampling circuit, which may indicate times at which the sampling circuit may sample the signal 102a, 102b (e.g. the square wave signal 102a) provided to it. In the example shown in FIG. 1, the sampling circuit, when sampling at sampling times TSS1, TSS2, TSS3 may sample the signal 102a at the sampling times TS1, TS2, TS3. The grid of uniformly spaced sampling times TG may be generated by and/or may be aligned to a reference signal having a reference frequency $f_{ref}$. A temporal distance between adjacent sampling times of the grid of uniformly spaced sampling times TG may be expressed as $t=T_{ref}/N$, where N may indicate a number of elements (e.g. delay elements) that may be included in the sampling circuit. For example, the sampling circuit includes, or may be, a delay line including a plurality of delay elements.

As shown in FIG. 1, selection of sampling times TS1, TS2, TS3 of the square wave 102a may be visualized as a selection of an edge of a resultant signal 104a. As shown in FIG. 1, a limited resolution and/or limited precision of the grid of uniformly spaced sampling times TG (e.g. as indicated by the fixed positions of the sampling times TSS1, TSS2, TSS3) may generate a quantization error in time QET, where the quantization error in time QET may be expressed as a difference between the candidate sampling times TC1, TC2, TC3 of the signal 102a and the sampling times TS1, TS2, TS3 of the signal 102a (equivalently, the sampling times TSS1, TSS2, TSS3 of the sampling circuit).

As shown in FIG. 1, in an example where a resultant signal 104b (e.g. a resultant discrete signal) may be generated from the sinusoidal signal 102b by means of a limited word-length lookup-table, amplitude quantization errors QEA may result, which may be expressed as an amplitude difference between an amplitude of the sinusoidal signal 102b and the resultant signal 104b at a respective sampling time TSS5, TSS6 of the sampling circuit.

Figure 2:
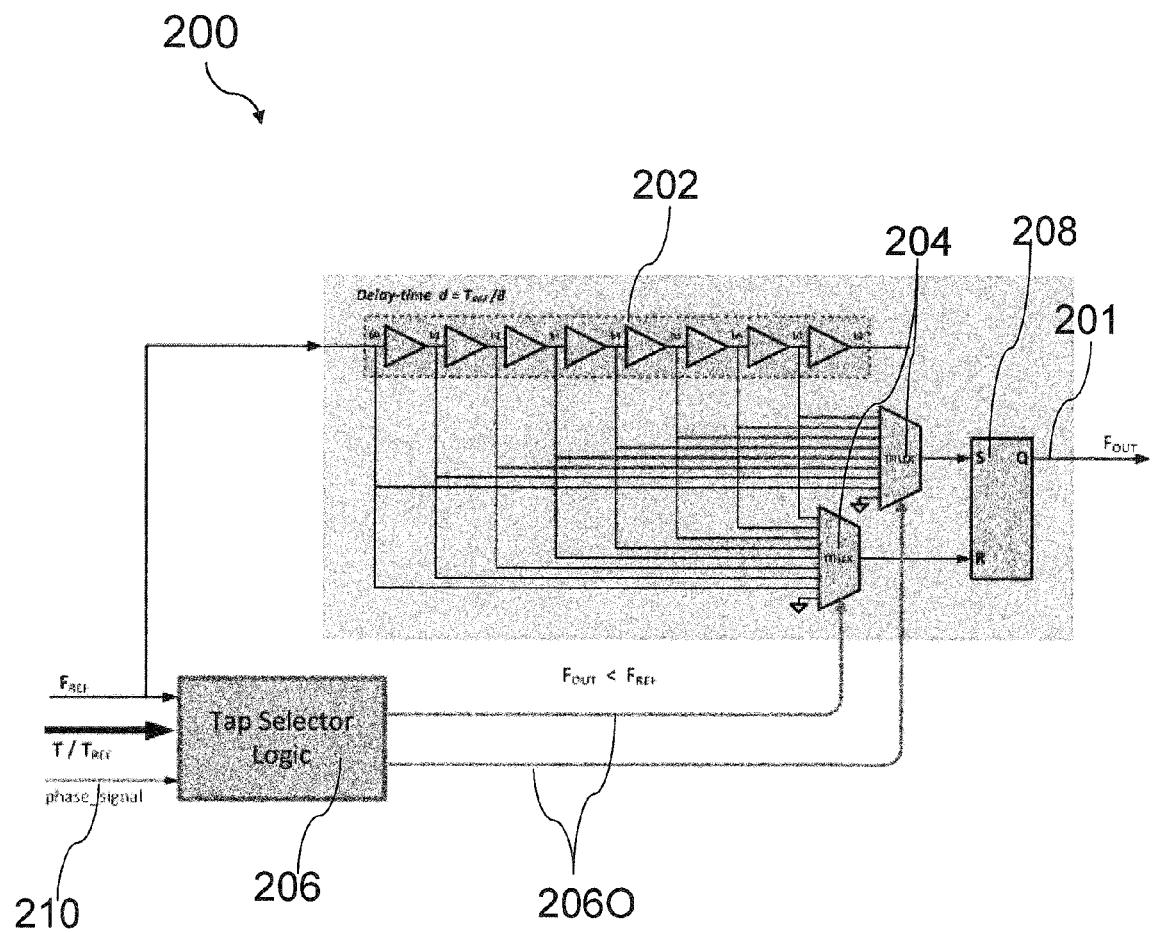
FIG. 2 shows a circuit configured to generate an output signal based on direct digital period synthesis.

FIG. 2 shows a circuit 200 configured to generate an output signal 201 based on direct digital period synthesis (DDPS).

The output signal 201 may, for example, be identified with the resultant signal 104a shown in FIG. 1. Accordingly, the output signal 201 shown in FIG. 2 and the resultant signal 104a shown in FIG. 1 may be used interchangeably in the description that follows.

As shown in FIG. 2, the circuit 200 may include the reference frequency $f_{ref}$ (e.g. as also shown in FIG. 1) provided to the circuit 200 and a sampling circuit 202.

The sampling circuit 202 may include, or may be, a delay line (e.g. a digital delay line), which may include a plurality of delay elements (indicated as b0 to b8 in FIG. 2). Only eight delay elements b0 to b8 are shown as an example, however the number of delay elements b0 to b8 may be less than eight (e.g. one, two, three, four, five, six, seven) or may be more than eight, e.g. nine, tens, or hundreds delay elements.

The circuit 200 may include a multiplexer 204 (e.g. at least one multiplexer, e.g. a plurality of multiplexers as shown in FIG. 2), which may be electrically coupled to the sampling circuit 202. The multiplexer 204 may allow a selection of specific elements (e.g. delay elements) of the sampling circuit (e.g. delay line) which may, for example, result in a selection of the sampling times TS1, TS2, TS3 of the square wave signal 102a as shown in FIG. 1). The circuit 200 may include an element selection circuit 206 (also indicated as "tap selector logic" in FIG. 2), which may determine an appropriate multiplexer-address for selecting an element (e.g. delay element) of the sampling circuit 202 (e.g. delay line). For example, with regards to FIG. 1, an output 206o of the element selection circuit 206 may include, or may be, the candidate sampling times TC1, TC2, TC3 of the signal 102a. The output 206o may be provided to the multiplexer 204, which may select sampling times TS1, TS2, TS3 of the signal 102a, 102b (e.g. the square wave 102a) based on the grid of uniformly spaced sampling times TG, which may in turn be based on the reference frequency $f_{req}$ provided to the sampling circuit 202.

The multiplexer 204 may toggle a flip-flop 208, which may in turn generate the output signal 201. Accordingly, an edge of the output signal 201 may be constructed based on the grid of uniformly spaced sampling times TG shown in FIG. 1. DDPS may be employed to generate an unmodulated output signal 201, as well as to generate an output signal 201 that may be modulated. In an example where the output signal 201 may be modulated a phase signal 210 may be provided to the element selection circuit 206 of the circuit 200.

Figure 3:
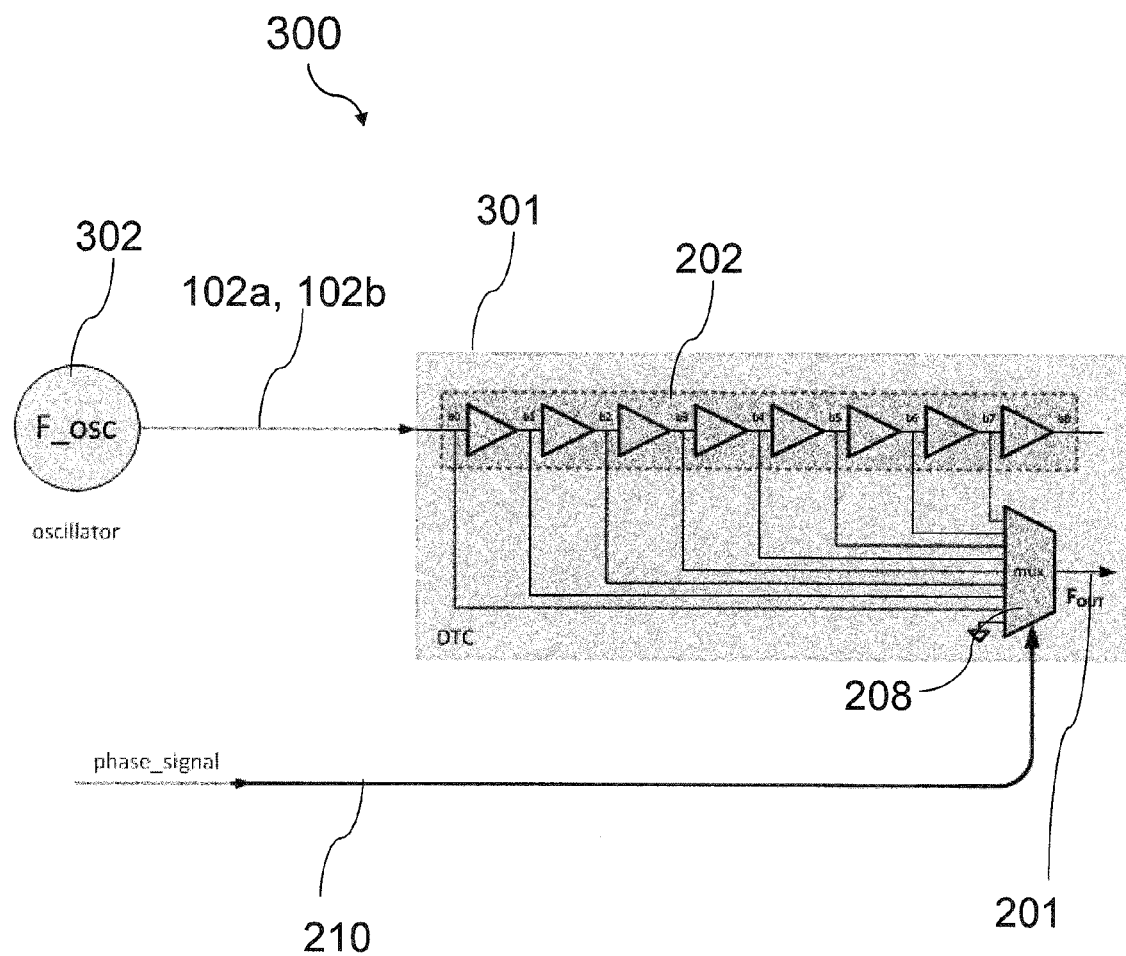
FIG. 3 shows a circuit configured to generate an output signal based on a digital to time convertor.

FIG. 3 shows a circuit 300 configured to generate the output signal 201 based on a digital to time convertor (DTC) 301.

Reference signs in FIG. 3 that are the same as in FIG. 2 denote the same or similar elements as in FIG. 2. Thus, those elements will not be described in detail again here; reference is made to the description above. Differences between FIG. 3 and FIG. 2 are described below.

As shown in FIG. 3, the circuit 300 may include an oscillator 302 (e.g. a fixed-frequency oscillator) that may be electrically connected to the DTC 301. The oscillator 302 may generate the signal 102a, 102b, and may provide the signal 102a, 102b to the DTC 301, which may be configured to modulate (e.g. phase modulate) the signal 102a, 102b. Depending on the phase signal 210 provided to the multiplexer 204 of the DTC 301, the signal 102a, 102b from the oscillator 302 may be delayed (e.g. by means of one or more elements of the sampling circuit 202).

In the circuit 200 shown in FIG. 2 (e.g. DDPS) and the circuit 300 shown in FIG. 3 (e.g. modulation with DTC 301), a precision of the output signal 201 may be limited to the grid of uniformly spaced sampling times TG.

Figure 4:
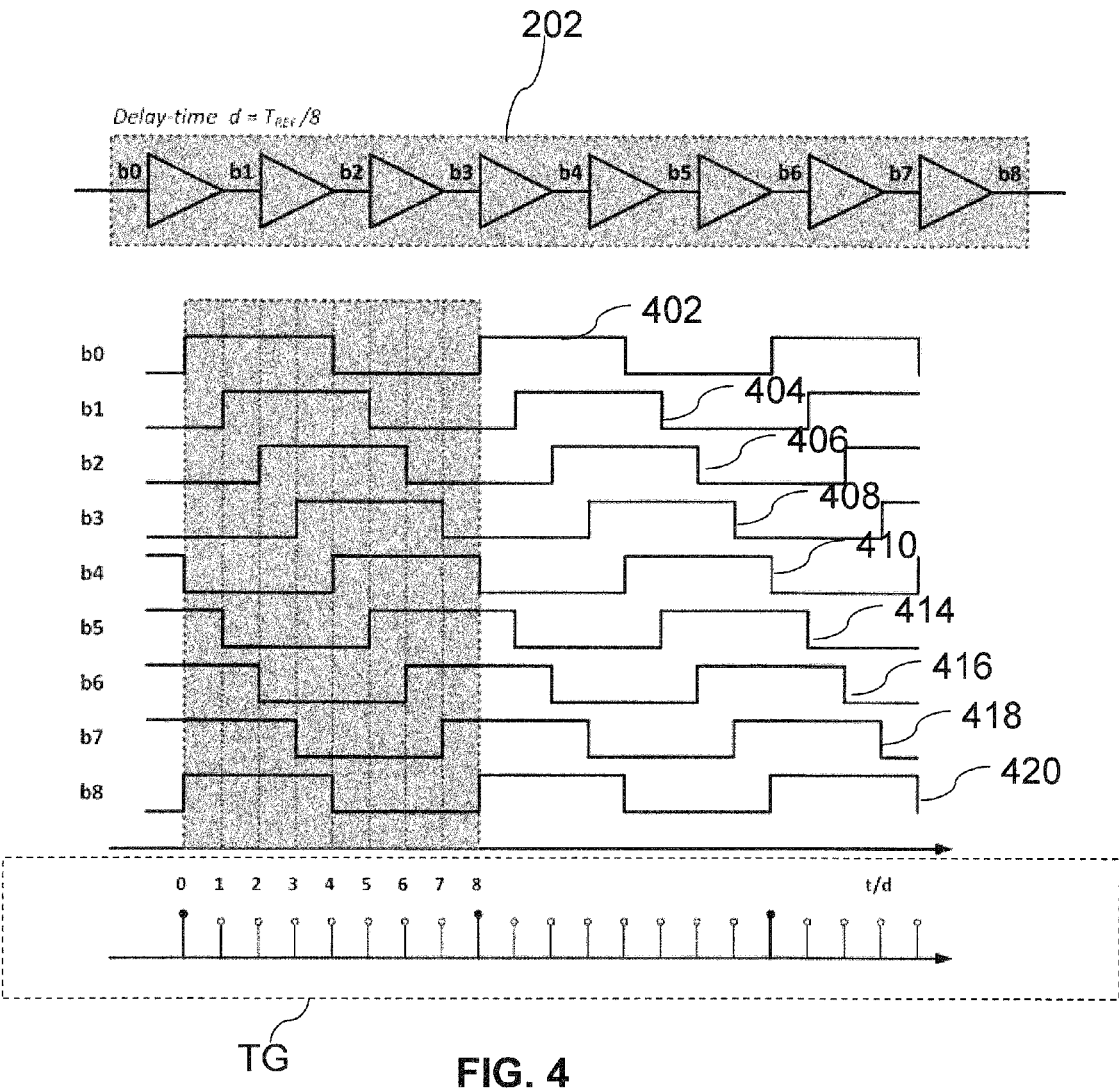
FIG. 4 shows a plurality of delayed copies of a square wave signal that may be quantized in time to a grid of uniformly spaced sampling times.

FIG. 4 shows a plurality of delayed copies 402 to 420 of the square wave signal 102a shown in FIG. 1 quantized in time to the grid of uniformly spaced sampling times TG.

In an example where the sampling circuit 202 may include a delay line including a plurality of delay elements, a delay-chain of n elements may offer n possible phase delayed copies of the square wave signal 102a, as shown in FIG. 4. These phase delayed copies may be used to construct the output signal 201 shown in FIG. 2 and FIG. 3. Examples of output signals 201 that may be constructed are shown in FIG. 5.

Figure 5:
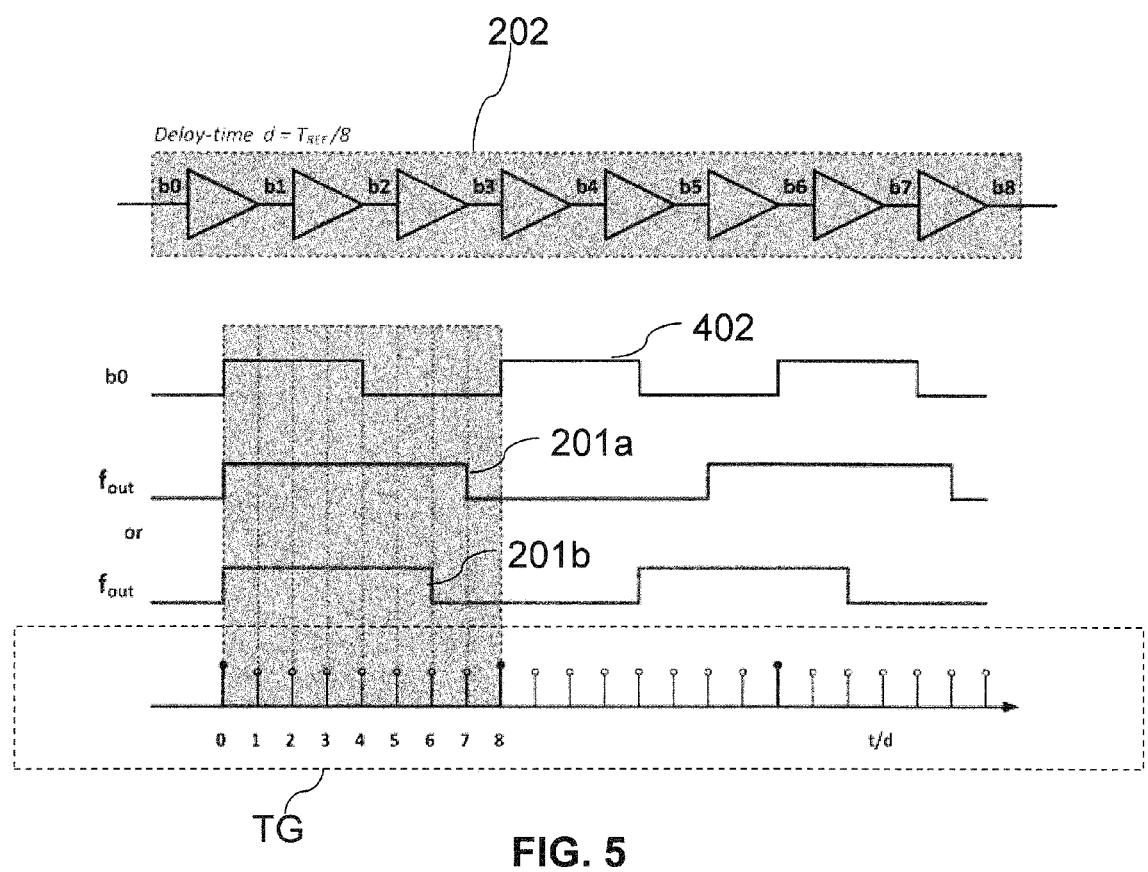
FIG. 5 shows output signals that may be constructed from the plurality of delayed signals shown in FIG. 4.

FIG. 5 shows output signals 201a, 201b that may be constructed from the plurality of delayed signals shown in FIG. 4.

In the circuit 200 shown in FIG. 2 (e.g. DDPS) and the circuit 300 shown in FIG. 3 (e.g. modulation with DTC 301), a limited number of possible positions for the sampling times TS1, TS2, TS3 may be available, and as shown in FIG. 1, a resulting quantization error (e.g. quantization error in time QET) may be inevitable due to the grid of uniformly spaced sampling times TG.

Beyond the quantization effects, deviations of transistor parameters may lead to non-identical behavior of the elements (e.g. delay elements) of the sampling circuit 202 (e.g. delay line) in terms of delay, threshold-voltages and slew-rate. These variations may lead a sampling time error introduced by the sampling circuit 202, which may manifest itself as individual deviations of each sample time of the grid of uniformly spaced sampling times TG. For instance, in an example where the sampling circuit 202 may include, or may be, a delay line including a plurality of delay elements, these variations may lead to individual deviations of each delay element of the delay line. Consequently a particular delay element of the delay line show the sum of all deviations of all delay elements from the first delay element of the delay line up to the particular delay element.

Both of these contributions (namely, the quantization error in time QET and the sampling time error introduced by the sampling circuit 202) to noise in the output signal 201 may be periodic in the time-domain, and may cause spurious peaks in the spectrum of the output signal 201. Another way of visualizing this may be a contribution of periodic noise (e.g. periodic in time) by the quantization error in time QET and the sampling time error introduced by the sampling circuit 202 to the signal 102a, 102b having candidate sampling times TC1, TC2, TC3, as shown in FIG. 1. In case of modulation of the signal 102a, 102b (e.g. carrier signal), the phase signal 210 may reduce or eliminate the periodicity of the quantization error in time QET and the sampling time error introduced by the sampling circuit 202, and may thus flatten the spurious peaks into an additional noise level, which may raise a noise floor of the output signal 201.

With regards to the quantization error in time QET, these quantization errors in time QET may, at first glance, be comparable to the quantization errors in amplitude known from classical digital signal processing, where A/D-converters and D/A-converters also have a limited resolution. For example, in these cases, an amplitude quantization error may be generated due to limited resolution (e.g. of an amplitude quantizer). By way of another example, at first glance, the sampling time error introduced by the sampling circuit 202 may be comparable to mismatch errors in the A/D-converters and/or D/A-converters, which may cause a deviation of the individual ideal amplitude quantization levels.

However, a difference between them is that in D/A-conversion, the errors (e.g. due to amplitude quantization and convertor mismatch) may corrupt a signal that may be represented by equally-time-distant samples. For example, an input of the D/A-converter may be provided with equally-distant samples and may be triggered with a periodic clock. Consequently, an output of the D/A-converter may be modeled as an ideal signal corrupted with equally-distant noise-contributions.

On the contrary, the effect of the quantization error in time QET and the sampling time error introduced by the sampling circuit 202 may not be modeled as equally-spaced error-contributions since the resulting signal may no longer be perfectly periodic due to the individual deviations of each sample time of the grid of uniformly spaced sampling times TG.

In order to mitigate or avoid the above mentioned effects of the quantization error in time QET and the sampling time error introduced by the sampling circuit 202, several currently available approaches may be taken.

A mixed signal circuit based approach may be a possible approach to mitigate or avoid the above mentioned effects of the quantization error in time QET and the sampling time error introduced by the sampling circuit 202.

For example, imperfections due to the quantization error in time QET may be reduced by decreasing the quantization step-size. For example, in the case of DDPS and/or using a DTC for modulation, a sampling circuit 202 (e.g. delay line) with significantly increased number of elements (e.g. delay elements) with a smaller time delay between the elements (e.g. delay elements) could reduce the quantization error in time QET. For instance, with such an approach the temporal distance between adjacent sampling times of the grid of uniformly spaced sampling times TG may be reduced to a sub-picosecond resolution.

However, significantly increasing the number of elements (e.g. delay elements) with a smaller time delay between the elements (e.g. delay elements) could require use of a circuit that may be more analog in nature (such as arrays of tunable RC elements), and may closely resemble the DCOs which may actually be substituted.

Moreover, significantly increasing the number of elements (e.g. delay elements) with a smaller time delay between the elements (e.g. delay elements) could result in significant challenges regarding calibration (fabrication effects) and adaptation during operation (environmental variations).

Furthermore, each doubling of the number of elements (e.g. delay elements) of the sampling circuit 202 may decreases the noise-floor by about 6 db. Consequently, power-consumption and area requirements for such an approach may not be feasible. Even further, significantly increasing the number of elements (e.g. delay elements) with a smaller time delay between the elements (e.g. delay elements) may not reduce or eliminate spurious tones that may result from quantization error in time QET and the sampling time error introduced by the sampling circuit 202.

Another example of a mixed signal approach may include attempting to measure and compensate for the quantization error in time QET and the sampling time error introduced by the sampling circuit 202. This may be performed on-chip. However, on-chip compensations may also be complicated, sensitive to variations, and may consume a lot of area and power.

The above-identified strategies in a mixed signal circuit based approach to avoid signal degradations caused by limited precision may increase a complexity of the mixed-signal parts of the circuitry.

Besides a mixed signal circuit based approach, a digital signal approach may be available to mitigate or avoid the above mentioned effects of the quantization error in time QET and the sampling time error.

For example, in the application of DDPS (e.g. without modulation) the limited precision of the sampling circuit 202 (e.g. delay line) may cause periodic error contributions to the signal 102a, as described above. Periodic errors may cause sharp spectral lines at the frequency $f_{SPUR}$ with $f_{SPUR}=1/T_{SPUR}$ and multiples of $f_{SPUR}$. The time $T_{SPUR}$ may represents the period-duration of the periodic noise with $T_{SPUR}=n*T_{REF}$, namely, $T_{SPUR}$ being some multiple of $T_{REF}$.

If the goal was to merely reduce these spurious peaks (e.g. spurs), this may be done by means of dithering, which may include masking this periodic noise contribution with some additional pseudo-random noise. Dithering may reduce the magnitude of such spurious peaks in the spectrum of the output signal 201, but it may increases an overall noise floor by adding additional noise.

An approach to compensate for the sampling time error introduced by the sampling circuit 202 may be to employ strategies similar to dynamic element matching (DEM), e.g. as it is known from A/D-converters. This approach may require switching between parts of the sampling circuit 202 using a plurality of multiplexers 204, which may again be sensitive to mismatch. Accordingly, this approach may not be an attractive approach in terms of realization.

Another approach to mitigate or eliminate the effects of the quantization error in time QET and the sampling time error introduced by the sampling circuit 202 may be to include noise shaping in the time domain, which may be known from TDCs (Digital to Time Converters). However, apart from specific TDC topologies, which may not be used for DDFS & DDM, such an approach may not provide a way to derive and/or store the quantization error in time QET and the sampling time error introduced by the sampling circuit 202 in the circuitry. In principle, the quantization error in time QET and the sampling time error introduced by the sampling circuit 202 may be calculated in the analog domain. However, since the quantization error in time QET and the sampling time error introduced by the sampling circuit 202 cannot be directly preserved or stored, these value may need to be converted into another intermediate physical quantity, thus resulting in considerable circuit overhead.

In light of the above-described currently available approaches and the drawbacks thereof, there may be a need to provide a method for determining the sampling times TS1, TS2, TS3 of the signal 102a that may be robust against quantization error in time QET and the sampling time error introduced by the sampling circuit 202.

There may be a need for a method for determining the sampling times TS1, TS2, TS3 of the signal 102a that may robust against the limited temporal resolution for potential edge positions of the resultant signal 104a.

There may be a need for a method for determining the sampling times TS1, TS2, TS3 of the signal 102a that may reduce or eliminate noise contributed to the spectrum of the signal 102a by spurious frequencies generated by quantization error in time QET and the sampling time error introduced by the sampling circuit 202.

There may be a need for a method for determining the sampling times TS1, TS2, TS3 of the signal 102a that may increase the SFDR (spurious-free dynamic range) of the resultant signal 104a.

Figure 6:
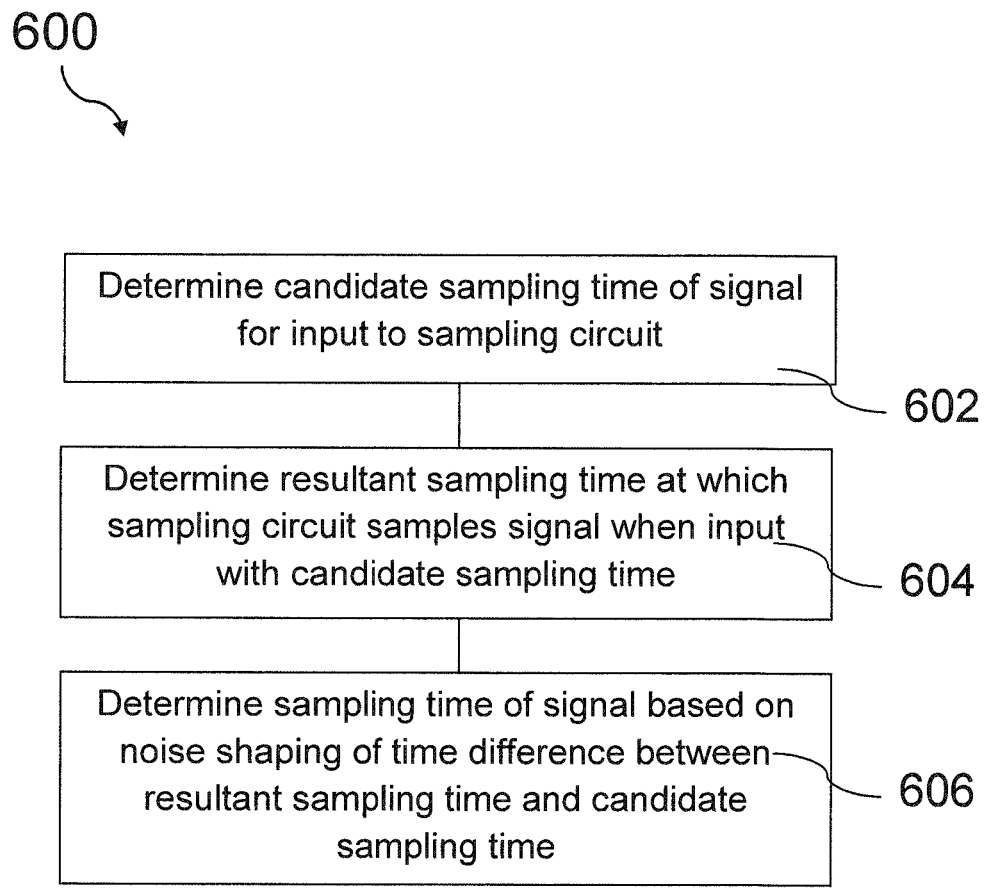
FIG. 6 shows a method for determining a sampling time of a signal.

At least one of the aforementioned needs may be met by the method 600 shown in FIG. 6.

FIG. 6 shows a method 600 for determining a sampling time of a signal.

The method 600 may, for example, be used to determine the sampling times TS1, TS2, TS3 of the signal 102a shown in FIG. 1.

The method 600 may include: determining a candidate sampling time of a signal for input to a sampling circuit (in 602); determining a resultant sampling time at which the sampling circuit samples the signal when input with the candidate sampling time (in 604); and determining a sampling time of the signal based on a noise shaping of a difference between the resultant sampling time and the candidate sampling time (in 606).

An effect provided by the method 600 may be robustness against quantization error in time (e.g. QET) and a sampling time error introduced by a sampling circuit (e.g. the sampling circuit 202).

An effect provided by the method 600 may be robustness against a limited temporal resolution for potential edge positions of a resultant signal (e.g. the resultant signal 104a) that may be generated by means of the method 600.

An effect provided by the method 600 may be reduction or elimination of noise contributed to the spectrum of a resultant signal (e.g. the resultant signal 104a) that may be generated by means of the method 600 by spurious frequencies generated by quantization error in time (e.g. QET) and a sampling time error introduced by a sampling circuit (e.g. the sampling circuit 202).

An effect provided by the method 600 may be increase of a SFDR (spurious-free dynamic range) of a resultant signal (e.g. the resultant signal 104a) that may be generated by means of the method 600.

The description that follows provides various examples that show examples of applying the method 600. An example of the method 600 applied to only the effects of quantization error in time (e.g. QET) is presented first. Thereafter, the description provides an example of the method 600 applied to the effects of quantization error in time (e.g. QET) and sampling time error introduced by a sampling circuit (e.g. the sampling circuit 202).

Figure 7:
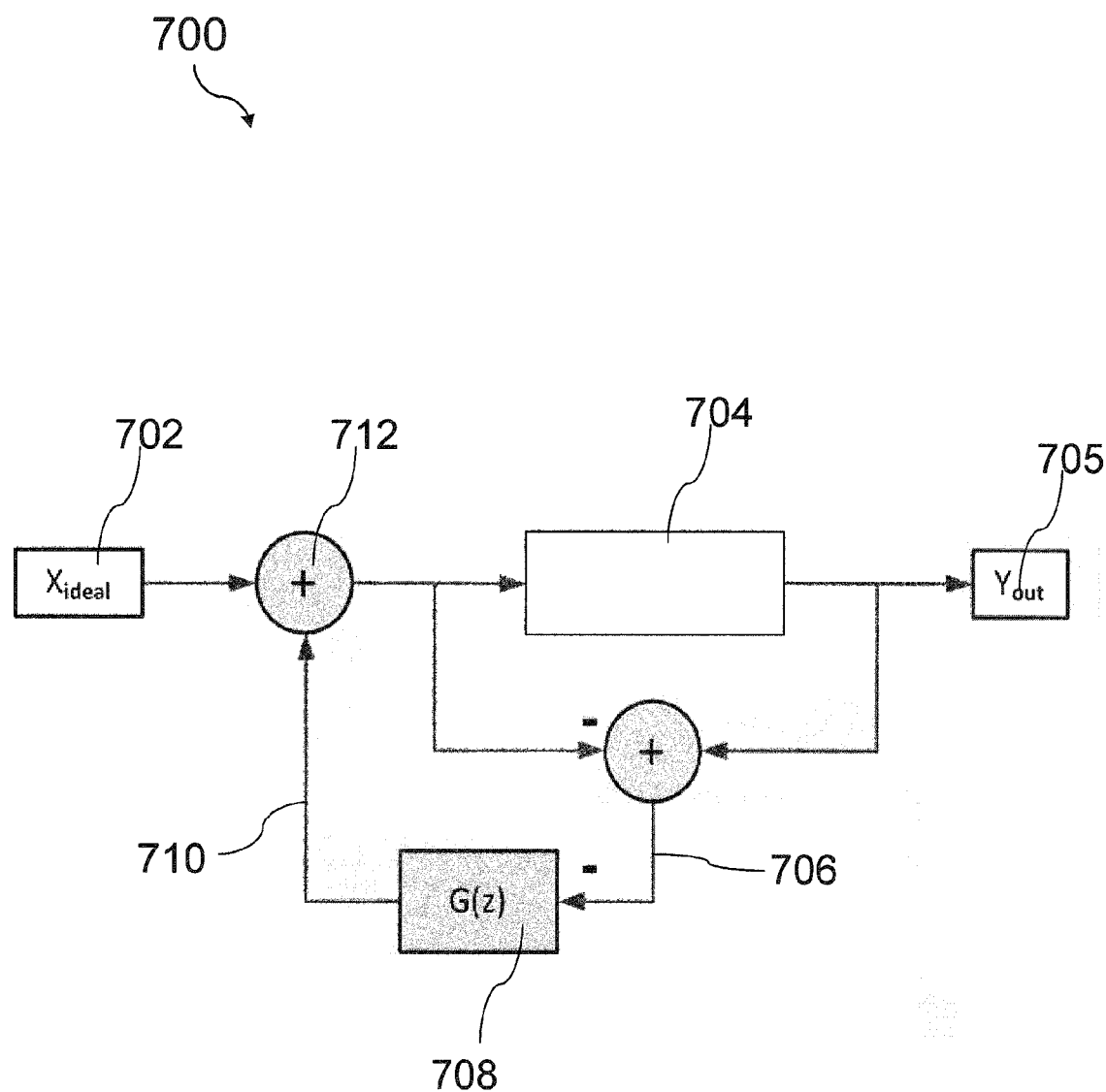
FIG. 7 shows a block diagram that shows an example of applying the method of FIG. 6.

FIG. 7 shows a block diagram 700 that shows an example of applying the method 600 shown in FIG. 6.

Figure 8:
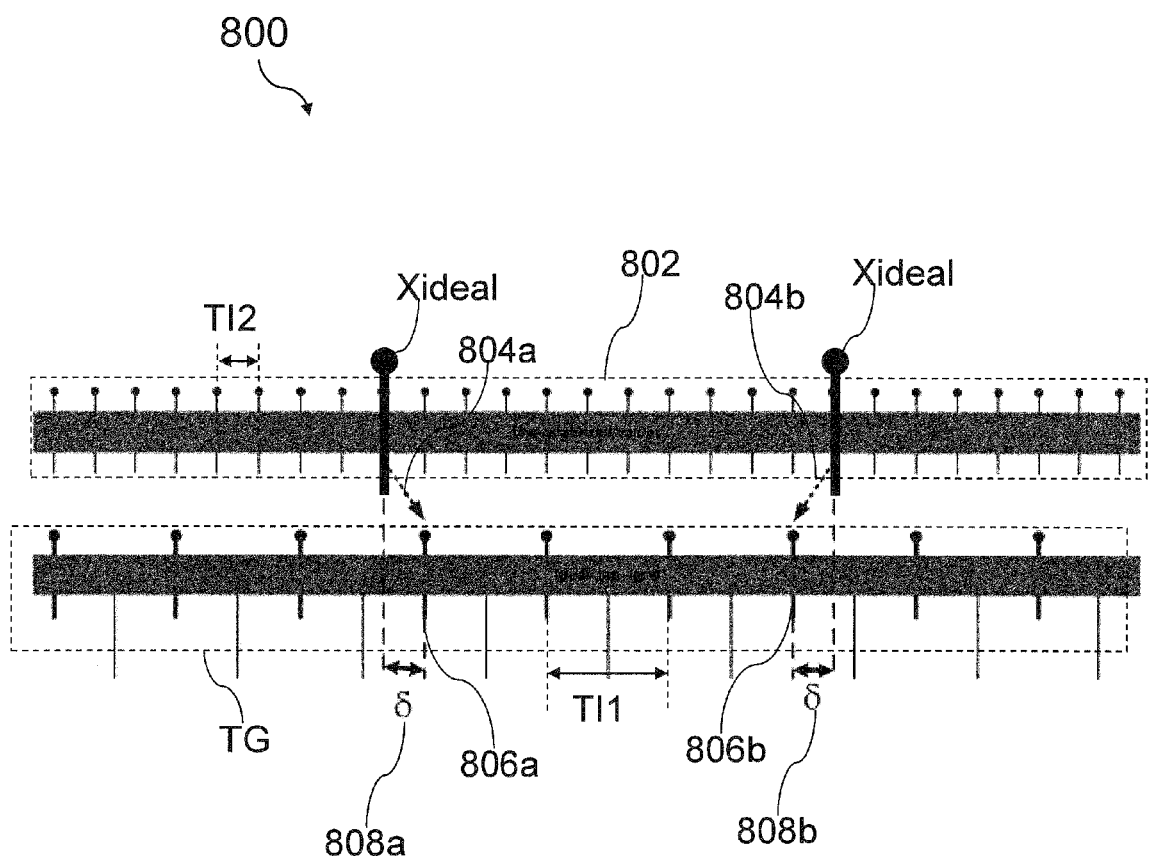
FIG. 8 shows a timing grid that shows sampling times disclosed in the method of FIG. 6.

FIG. 8 shows a timing grid 800 that shows sampling times disclosed in the method 600 shown in FIG. 6.

As described above, FIG. 7 and FIG. 8 provide an example of the method 600 applied to an example that considers only the effects of quantization error in time (e.g. QET).

Reference signs in FIG. 7 and FIG. 8 that are the same as in FIG. 1 to FIG. 5 denote the same or similar elements as in FIG. 1 to FIG. 5. Thus, those elements will not be described in detail again here; reference is made to the description above. Differences between FIG. 7 and FIG. 8 and FIG. 1 to FIG. 5 are described below.

As described above in relation to FIG. 6, the method 600 may include determining a candidate sampling time of a signal for input to a sampling circuit (in 602). The candidate sampling times are indicated in FIG. 7 as $X_{ideal}$ 702. In the case of noise-shaping for DDPS and/or modulation with DTC, the candidate sampling times $X_{ideal}$ 702 may represent an ideal edge position of the phase signal 210 shown in FIG. 2 and FIG. 3. As a further example, the candidate sampling times $X_{ideal}$ may, for example, be identified with the candidate sampling times TC1, TC2, TC3 of the signal 102a shown in FIG. 1. The candidate sampling times $X_{ideal}$ 702 is also shown in the timing grid 800 shown in FIG. 8.

The signal (e.g. the signal 102a) may include, or may be, a digital signal. Accordingly, the signal may be quantized in time onto a grid 802 (shown in FIG. 8), which may be more finely quantized than, for example, the grid of uniformly spaced sampling times TG, which is also shown in FIG. 8. In other words, a time interval TI1 between consecutive sampling times of the grid of uniformly spaced sampling times TG may be larger than a time interval TI2 between consecutive sampling times of grid 802 onto which the signal (e.g. the signal 102a) may be quantized.

As shown in FIG. 8, the candidate sampling times $X_{ideal}$ may be rounded to the grid of uniformly spaced sampling times TG (indicated by arrows 804a, 804b). The candidate sampling times $X_{ideal}$ may be rounded to sampling times of the grid of uniformly spaced sampling times TG that may be closest in time to the candidate sampling times $X_{ideal}$ In other words, a resultant sampling time (e.g. resultant sampling times 806a, 806b) at which the sampling circuit samples the signal when input with the candidate sampling times $X_{ideal}$ may be determined, as disclosed in 604 of method 600. Stated in yet another way, determining the resultant sampling times 806a, 806b at which the sampling circuit samples the signal when input with the candidate sampling times $X_{ideal}$ may include determining sampling times of the sampling circuit closest in time to the candidate sampling times $X_{ideal}$. In relation to FIG. 7, this rounding may be performed by the block 704.

As shown in FIG. 8, there may be a difference (e.g. differences 808a, 808b) between the resultant sampling times 806a, 806b and the candidate sampling times $X_{ideal}$. The differences 808a, 808b is indicated in FIG. 7 by a difference 706 between the output of the block 704 and the input of the block 704. The difference 706 (e.g. time difference) may be noise shaped, e.g. by means of the noise shaper 708 shown in FIG. 7.

Figure 9:
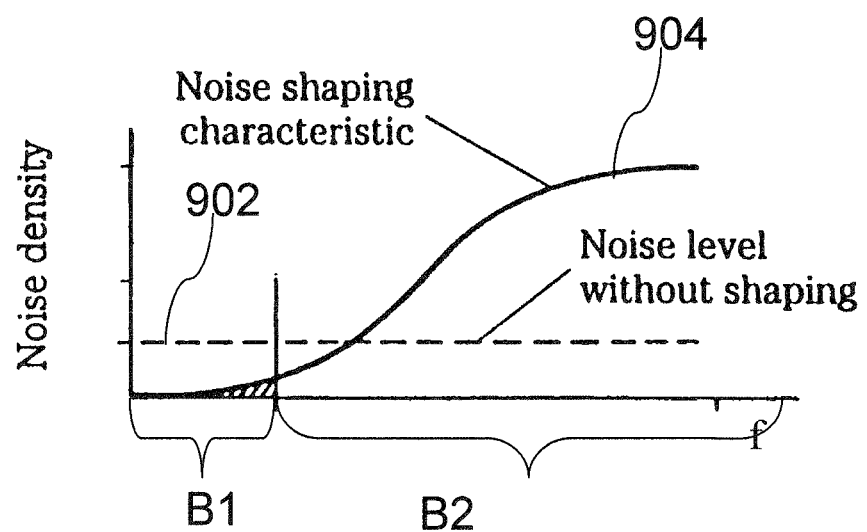
FIG. 9 shows an example of a power spectral density of a difference before noise shaping and a power spectral density of the difference after noise shaping.

FIG. 9 shows an example of a power spectral density 902 of the differences 808a, 808b before noise shaping and a power spectral density 904 of the differences 808a, 808b after noise shaping.

The spectrum of the signal 102a may be contained within a band of frequencies. The band of frequencies within which the spectrum of the signal 102a may be contained is indicated as a first band of frequencies B1 in FIG. 9.

Noise shaping of the differences 808a, 808b may include filtering the spectrum 902 of the differences 808a, 808b. As shown in FIG. 9, filtering the spectrum 902 of the differences 808a, 808b may include attenuating the spectrum 902 of the difference 808a, 808b within the first band of frequencies B1, namely, the band of frequencies within which the spectrum of the signal 102a may be contained.

As shown in FIG. 9, filtering the spectrum 902 of the differences 802a, 802b may include amplifying the spectrum 902 of the differences 802a, 802b within a second band of frequencies B2. The first band of frequencies B1 and the second band of frequencies B2 may be non-overlapping frequency bands. In other words, the spectrum (or a portion of the spectrum) of the signal 102a may not be contained within the second band of frequencies B2.

As described above, the quantization error in time (e.g. QET) may be periodic and consequently may generate spurious peaks in the spectrum of the resultant signal 104a. Feeding back the noise shaped differences 808a, 808b (indicated by 710 in FIG. 7) may break this periodicity, and may reduce these spurs.

The sampling time of the signal is indicated as output $Y_{out}$ 705 in FIG. 7. As shown in FIG. 7, the sampling time of the signal $Y_{out}$ 705 may be based on the noise shaped differences 808a, 808b (indicated by 710 in FIG. 7) and the candidate sampling times $X_{ideal}$.

The sampling time of the signal $Y_{out}$ 705 may be provided to the input (e.g. address inputs) of a multiplexer (e.g. the multiplexer 204 shown in FIG. 2 and FIG. 3). For example, the block diagram 700 may be arranged between the phase signal 210 and the multiplexer 208 shown in FIG. 2 and FIG. 3.

A deviation of the sampling times $Y_{out}$ 705 of the signal from the resultant sampling times 806a, 806b as a result of the noise shaping may be larger or smaller than the differences 808a, 808b prior to noise shaping. However, in case the overall spectrum of the resultant signal 104a is considered, the spectral contribution of the noise generated quantization error in time (e.g. QET) to the signal 102a may be mitigated or reduced.

As shown in FIG. 7, the method 600 may further include summing the candidate sampling times $X_{ideal}$ 702 of the signal (e.g. the signal 102a) and the noise shaped differences 808a, 808b (indicated by 710 in FIG. 7). As shown in FIG. 7, determining the sampling time of the signal based on the noise shaped differences 808a, 808b may include determining the sampling time $Y_{out}$ of the signal (e.g. the signal 102a) based on the sum of the candidate sampling times $X_{ideal}$ 702 and the noise shaped differences 808a, 808b (indicated by 710 in FIG. 7).

The description that follows provides an example of the method 600 applied to an example that considers the effects of quantization error in time (e.g. QET) and sampling time error introduced by a sampling circuit (e.g. the sampling circuit 202).

As described above, sampling time error introduced by a sampling circuit may result in a non-uniform grid TG', e.g. due to the individual deviations of each sample time of the grid of uniformly spaced sampling times TG.

Figure 10:
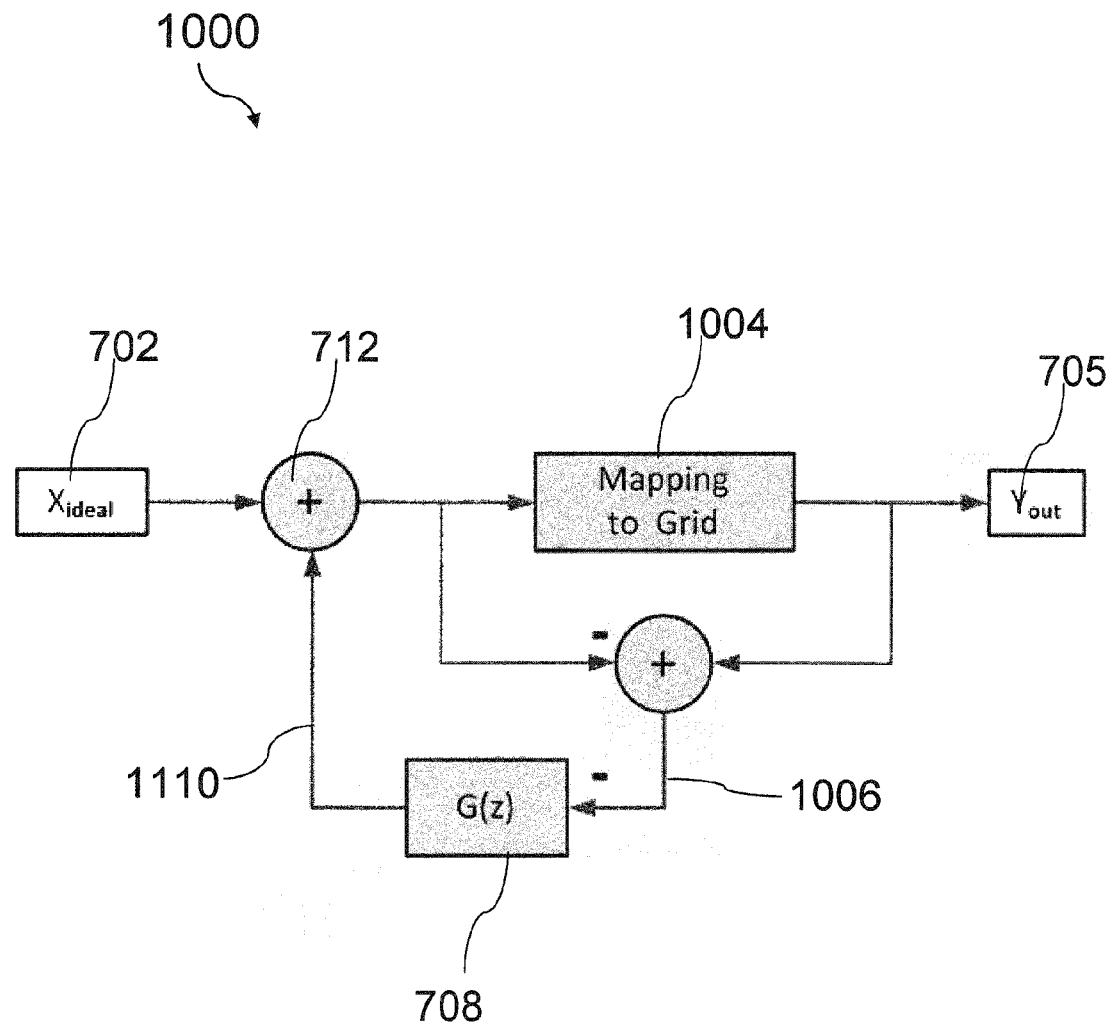
FIG. 10 shows a block diagram that shows an example of applying the method of FIG. 6 in case sampling time error introduced by a sampling circuit is considered.

FIG. 10 shows a block diagram 1000 that shows an example of applying the method 600 shown in FIG. 6 in case a sampling time error introduced by a sampling circuit is considered.

Figure 11:
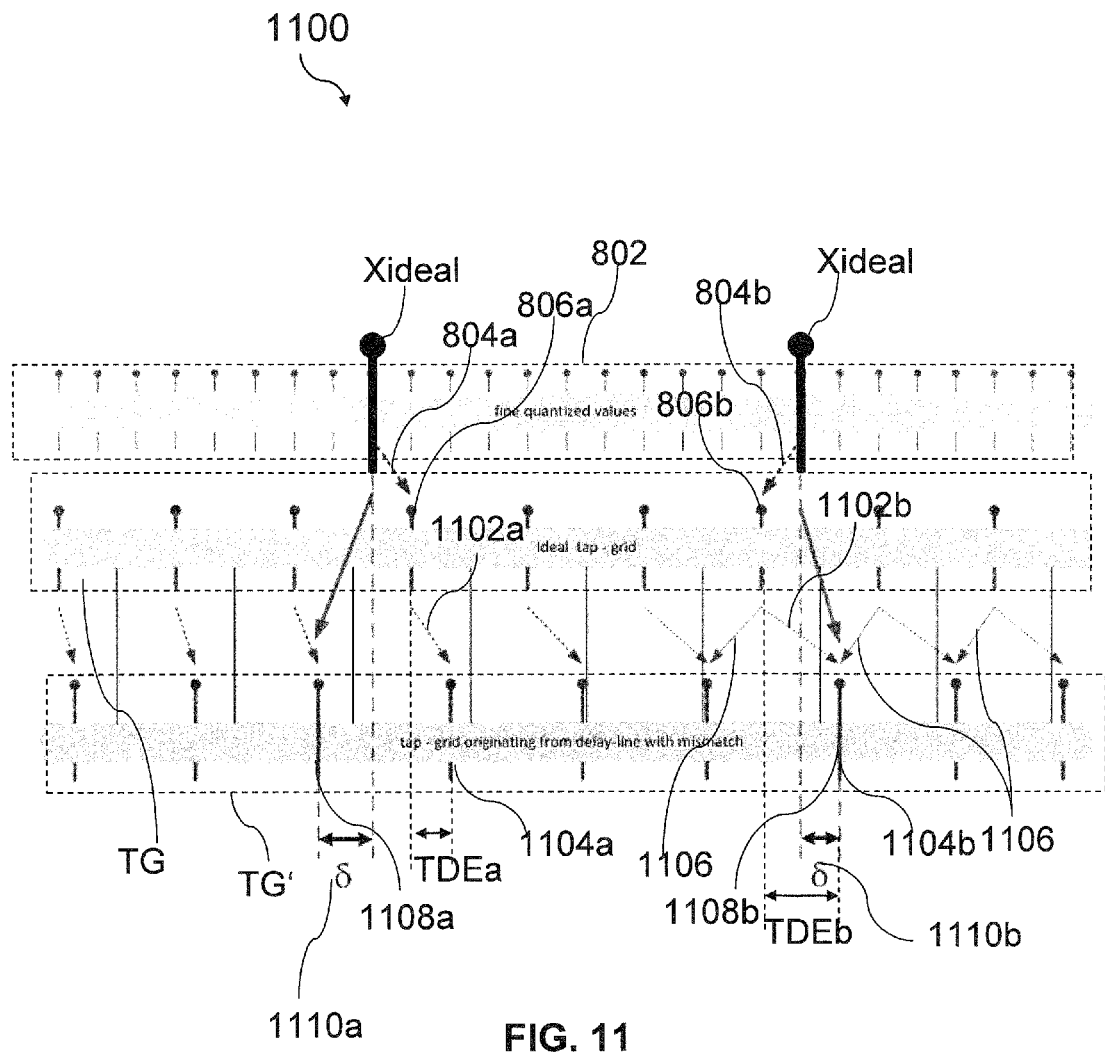
FIG. 11 shows a timing grid that shows sampling times disclosed in the method of FIG. 6 in case sampling time error introduced by a sampling circuit is considered.

FIG. 11 shows a timing grid 1100 that shows sampling times disclosed in the method 600 shown in FIG. 6 in case sampling time error introduced by a sampling circuit is considered.

FIG. 10 and FIG. 11 provide an example of the method 600 applied to an example that considers the effects of quantization error in time (e.g. QET) and the sampling time error introduced by a sampling circuit.

Reference signs in FIG. 10 and FIG. 11 that are the same as in FIG. 7 to FIG. 8 denote the same or similar elements as in FIG. 7 to FIG. 8. Thus, those elements will not be described in detail again here; reference is made to the description above. Differences between FIG. 10 and FIG. 11 and FIG. 7 to FIG. 8 are described below.

In order to consider the influence of the sampling time error introduced by a sampling circuit (also referred to as a mismatch) it may be assumed that during an initialization phase of the sampling circuit, some calibration may be performed. Accordingly, some measurements of the sampling time error introduced by the sampling circuit may be performed. Optionally or additionally, re-characterizations during operation may be applied.

In relation to FIG. 11, determining a resultant sampling time at which the sampling circuit samples the signal when input with the candidate sampling time (in 604) may include determining time delay errors TDEa, TDEb introduced by the sampling circuit to ideal sampling times 806a, 806b of the grid of uniformly spaced sampling times TG.

As shown in FIG. 11, the sampling time errors TDEa, TDEb introduced by the sampling circuit may result in a non-uniform grid TG'. Arrows 1102a, 1102b indicate an association between ideal sampling times 806a, 806b and their corresponding sampling times 1104a, 1104b. Arrows 1106 may indicate that ideal sampling times of the sampling circuit degraded by the mismatch may be closer to an adjacent ideal sampling time than to the originally intended ideal sampling time.

As shown in FIG. 11, determining the resultant sampling times 1108a, 1108b at which the sampling circuit samples the signal when input with the candidate sampling times $X_{ideal}$ may include rounding the candidate sampling times $X_{ideal}$ sampling times of the non-uniform grid TG' (which may be determined based on the sampling time error TDEa, TDEb) that may be closest in time to the candidate sampling time $X_{ideal}$. In relation to FIG. 10, this rounding may be performed by the block 1004.

As shown in FIG. 11, there may be differences 1110a, 1110b between the resultant sampling times 1108a, 1108b and the candidate sampling times $X_{ideal}$. The differences 1110a, 1108b are indicated in FIG. 10 by a difference 1006 between the output of the block 1004 and the input of the block 1004. The difference 1006 may be noise shaped (e.g. by means of the noise shaper 708 shown in FIG. 10), as described above in relation to FIG. 7.

It may be noted that measurements of the sampling time errors TDEa, TDEb introduced by the sampling circuit may not be perfect, e.g. since such measurements may be based on devices that may be limited in resolution and/or may have measurement inaccuracies. However, even with such limited knowledge of the sampling time errors TDEa, TDEb introduced by the sampling circuit, the noise shaping process (e.g. performed by means of the noise shaper 708) may remain stable. For example, measurement limitations may decrease the performance gain (e.g. as determined by the noise introduced by the sampling time errors TDEa, TDEb to the signal 102b), however, a stability of the circuit 1000 may not be adversely affected.

Figure 12:
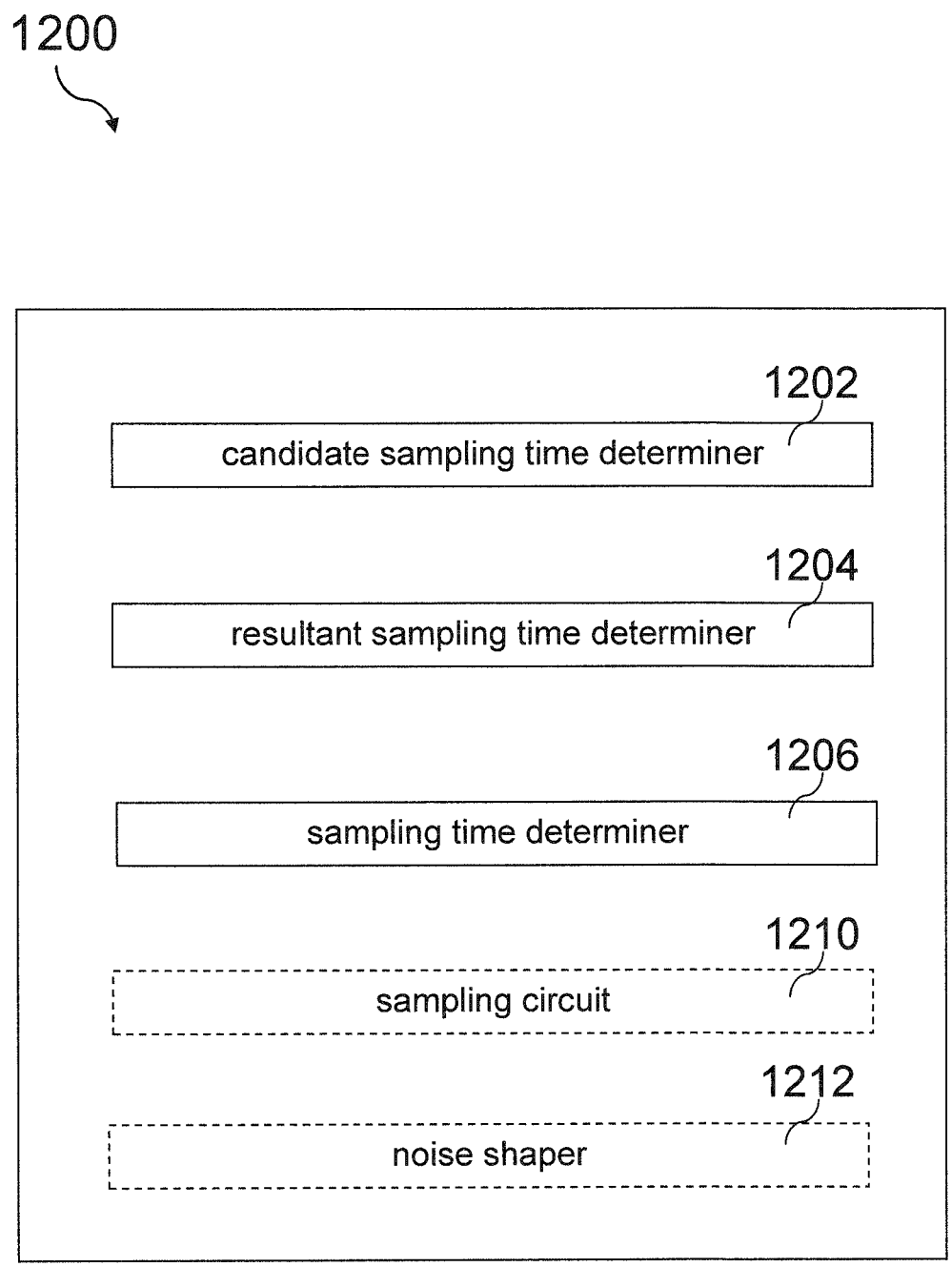
FIG. 12 shows a device for determining a sampling time of a signal.

FIG. 12 shows a device 1200 for determining a sampling time of a signal.

The device 1200 may, for example, be configured to perform the method 600 described above in relation to FIG. 6.

The device 1200 may include a candidate sampling time determiner 1202, which may be configured to determine a resultant sampling time at which the sampling circuit samples the signal when input with the candidate sampling time.

The device 1200 may include a resultant sampling time determiner 1204, which may be configured to determine a sampling time error introduced by a sampling circuit.

The device 1200 may include a sampling time determiner 1206, which may be configured to determine a sampling time of the signal based on a noise shaping of a difference between the resultant sampling time and the candidate sampling time.

The device 1200 may further include the sampling circuit 1210 (e.g. described above) and/or a noise shaper 1212 (e.g filter), e.g. described above. The noise shaper 1212 may be configured to noise shape (e.g. filter) the difference between the resultant sampling time and the candidate sampling time.

As described above, the device 1200 may, for example, be configured to perform the method 600 described above in relation to FIG. 6. Accordingly, various examples and aspects described in the context of the method 600 may be analogously valid for the device 1200.

According to various examples presented herein, use of noise shaping may modify the position of the edges (in time-domain) of a resultant signal (e.g. the resultant signal 104a) that may be generated by means of the method 600 and/or the device 1200 configured to perform the method 600.

According to various examples presented herein, use of noise shaping may allow the reduction of spurious frequencies that may occur within the frequency band occupied by the signal 102a, 102b, and hence may improve the noise-level of the resultant signal (e.g. the resultant signal 104a).

According to various examples presented herein, noise-shaping may be applied to time-domain errors.

According to various examples presented herein, noise-shaping may be performed by means of digital processing (e.g. without analog processing, namely, pure digital processing).

According to various examples presented herein, mismatch errors (e.g. the sampling time error TDEa, TDEb introduced by the sampling circuit) may be noise shaped based on knowledge of mismatch errors (e.g. by means of measurement of mismatch errors which generally does not need to be perfect), however, without calibration or adaptation with respect to mismatch errors.

According to various examples presented herein, noise shaping can be used to reduce the in band noise in applications like DDPS or modulation of a carrier with a DTC in case of quantization and mismatch errors. The effect of mismatch may have to been determined (e.g. by measurement e.g. during a startup phase of the sampling circuit).

While the examples presented above show that noise-shaping may be applied to time-domain errors e.g. caused by quantization error in time (e.g. QET) and the sampling time error introduced by a sampling circuit, an analogous method may be applied to amplitude-domain errors caused by quantization error in amplitude (e.g. QEA) and a quantization level error introduced by a mismatch of a quantization circuit.

In other words, an analogous method may be applied to cope with mismatch in the amplitude domain (e.g. time discrete, uniformly spaced samples in time). Similar to the above-described processing of delay-variations caused by quantization error in time (e.g. QET) and the sampling time error introduced by a sampling circuit, a noise-shaper processing quantization errors in amplitude (e.g. QEA) based on uniformly spaced samples in time may be enhanced to additionally process amplitude errors (e.g. quantization level errors) that may be caused by mismatch. Corresponding to the approach used for timing-deviations, the amplitude-deviations caused by mismatch may be determined in an initialization phase (e.g. with optional re-characterization during regular operation).

FIG. 13 shows a method 1300 for determining a sampling parameter of a signal.

The sampling parameter of a signal may, for example, include, or may be, a quantization level of a signal (e.g. equally spaced in time) or a sampling time of a signal (e.g. as described above in relation to method 600).

The method 1300 may include: determining a candidate sampling parameter of a signal (in 1302); determining a sampling parameter error introduced by a circuit (in 1304); determining, based on the sampling parameter error, a resultant sampling parameter resulting from the candidate sampling parameter (in 1306); and determining a sampling parameter of the signal based on a noise shaping of a difference between the resultant sampling parameter and the candidate sampling parameter of the signal (in 1308).

With regards to determining a candidate sampling parameter of a signal (in 1302), the candidate sampling parameter may include, or may be, a candidate quantization level of a signal (e.g. equally spaced in time) or a candidate sampling time of a signal (e.g. as described above in relation to method 600).

With regards to determining a sampling parameter error introduced by a circuit (in 1304), the circuit may include, or may be, a quantization circuit or a sampling circuit (e.g. as described above in relation to method 600).

With regards to determining a sampling parameter error introduced by a circuit (in 1304), the sampling parameter error may include, or may be, a quantization level error or a sampling time error (e.g. as described above in relation to method 600).

With regards to determining, based on the sampling parameter error, a resultant sampling parameter resulting from the candidate sampling parameter (in 1306), the resultant sampling parameter may include, or may be, a resultant quantization level or a resultant sampling time (e.g. as described above in relation to method 600).

The following examples pertain to further embodiments.

Example 1 is a method for determining a sampling time of a signal, the method comprising: determining a candidate sampling time of a signal for input to a sampling circuit; determining a resultant sampling time at which the sampling circuit samples the signal when input with the candidate sampling time; and determining a sampling time of the signal based on a noise shaping of a difference between the resultant sampling time and the candidate sampling time.

In Example 2, the subject matter of Example 1 can optionally include that the noise shaping of the difference comprises filtering a spectrum of the difference.

In Example 3, the subject matter of Example 2 can optionally include that filtering the spectrum of the difference comprises attenuating the spectrum of the difference within a first band of frequencies.

In Example 4, the subject matter of Example 2 can optionally include that filtering the spectrum of the time difference comprises attenuating the spectrum of the difference within a first band of frequencies and amplifying the spectrum of the difference within a second band of frequencies, wherein the first and second bands of frequencies are non-overlapping frequency bands.

In Example 5, the subject matter of any one of Examples 3-4 can optionally include that a spectrum of the signal is contained within the first band of frequencies.

In Example 6, the subject matter of Example 1 can optionally include: summing the candidate sampling time of the signal and the noise shaped difference; and determining the sampling time of the signal based on the sum of the candidate sampling time and the noise shaped difference.

In Example 7, the subject matter of Example 1 can optionally include that the signal comprises a carrier signal.

In Example 8, the subject matter of Example 1 can optionally include that the signal comprises a modulating signal configured to modulate a phase of a carrier signal.

In Example 9, the subject matter of Example 1 can optionally include that the signal comprises a square wave signal.

In Example 10, the subject matter of Example 1 can optionally include that the signal comprises a sinusoidal signal.

In Example 11, the subject matter of Example 1 can optionally include that the candidate sampling time of the signal comprises a time of a zero-crossing of the signal.

In Example 12, the subject matter of Example 1 can optionally include that the candidate sampling time of the signal comprises a time the signal changes from a first value to a second value.

In Example 13, the subject matter of Example 1 can optionally include that the candidate sampling time of the signal comprises a time of a rising edge or a falling edge of the signal.

In Example 14, the subject matter of Example 1 can optionally include that the sampling circuit comprises a delay line comprising a plurality of delay elements.

In Example 15, the subject matter of Example 1 can optionally include that determining the resultant sampling time comprises determining a sampling time of the sampling circuit closest in time to the candidate sampling time.

In Example 16, the subject matter of Example 1 can optionally include that the resultant sampling time comprises an ideal sampling time of the sampling circuit.

In Example 17, the subject matter of Example 16 can optionally include that the resultant sampling time further comprises a time delay error introduced by the sampling circuit to the ideal sampling time.

Example 18 is a device for determining a sampling time of a signal, the device comprising: a candidate sampling time determiner configured to determine a candidate sampling time of a signal for input to a sampling circuit; a resultant sampling time determiner configured to determine a resultant sampling time at which the sampling circuit samples the signal when input with the candidate sampling time; and a sampling time determiner configured to determine a sampling time of the signal based on a noise shaping of a difference between the resultant sampling time and the candidate sampling time.

In Example 19, the subject matter of Example 18 can optionally include the sampling circuit.

In Example 20, the subject matter of Example 18 can optionally include a noise shaper configured to noise shape the difference between the resultant sampling time of and the candidate sampling time.

In Example 21, the subject matter of Example 20 can optionally include that the noise shaper comprises a filter configured to shape a spectrum of the difference.

In Example 22, the subject matter of Example 21 can optionally include that the filter is configured to attenuate the spectrum of the difference.

In Example 23, the subject matter of Example 21 can optionally include that the filter is configured to shift the spectrum of the difference to a predetermined band of frequencies, wherein the predetermined band of frequencies and a spectrum of the signal are in non-overlapping frequency bands.

In Example 24, the subject matter of Example 18 can optionally include that the signal comprises a carrier signal having a carrier frequency.

In Example 25, the subject matter of Example 18 can optionally include that the signal comprises a square wave signal.

In Example 26, the subject matter of Example 18 can optionally include that the candidate sampling time of the signal comprises a time of a zero-crossing of the signal.

In Example 27, the subject matter of Example 18 can optionally include that the candidate sampling time of the signal comprises a time the signal changes from a first value to a second value.

In Example 28, the subject matter of Example 18 can optionally include that the candidate sampling time of the signal comprises a time of a rising edge or a falling edge of the signal.

In Example 29, the subject matter of Example 19 can optionally include that the sampling circuit comprises a delay line comprising a plurality of delay elements.

In Example 30, the subject matter of Example 19 can optionally include that the sampling time error comprises a time delay error introduced by the sampling circuit to an ideal sampling time of the sampling circuit.

In Example 31, the subject matter of Example 18 can optionally include that the resultant sampling time determining device is configured to determine a sampling time of the sampling circuit closest in time to the candidate sampling time.

In Example 32, the subject matter of Example 31 can optionally include that the sampling time of the sampling circuit comprises an ideal sampling time of the sampling circuit and the sampling time error introduced by the sampling circuit to the ideal sampling time.

Example 33 is a method for determining a sampling parameter of a signal, the method comprising: determining a candidate sampling parameter of a signal; determining a sampling parameter error introduced by a circuit; determining, based on the sampling parameter error, a resultant sampling parameter resulting from the candidate sampling parameter; and determining a sampling parameter of the signal based on a noise shaping of a difference between the resultant sampling parameter and the candidate sampling parameter of the signal.

In Example 34, the subject matter of Example 33 can optionally include that the sampling parameter of the signal comprises a quantization level of the signal or a sampling time of the signal.

In Example 35, the subject matter of Example 33 can optionally include that the candidate sampling parameter comprises a candidate quantization level of the signal or a candidate sampling time of the signal.

In Example 36, the subject matter of Example 33 can optionally include that the circuit comprises a quantization circuit or a sampling circuit.

In Example 37, the subject matter of Example 33 can optionally include that the sampling parameter error comprises a quantization level error or a sampling time error.

In Example 38, the subject matter of Example 33 can optionally include that the resultant sampling parameter comprises a resultant quantization level or a resultant sampling time.

Example 39 is a device for determining a sampling time of a signal, the device comprising: a means for determining a candidate sampling time of a signal; a means for determining a sampling time error introduced by a sampling circuit; a means for determining, based on the sampling time error, a resultant sampling time of the sampling circuit resulting from the candidate sampling time; and a means for determining a sampling time of the signal based on a noise shaping of a difference between the resultant sampling time of the sampling circuit and the candidate sampling time of the signal.

Various examples and aspects described in the context of one of the devices or methods described herein may be analogously valid for the other devices or methods described herein.

While various aspects have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for determining a sampling time of a signal, the method comprising:
   determining a candidate sampling time of a signal for input to a sampling circuit;
   determining a resultant sampling time at which the sampling circuit maps the candidate sampling time with a predefined quantization grid; and
   determining a sampling time of the signal based on a noise shaping of a time quantization error between the resultant sampling time and the candidate sampling time.

2. The method of claim 1, wherein the noise shaping of the difference comprises filtering a spectrum of the time quantization error.

3. The method of claim 2, wherein filtering the spectrum of the time quantization error comprises attenuating the spectrum of the time quantization error within a first band of frequencies and amplifying the spectrum of the time quantization error within a second band of frequencies, wherein the first and second bands of frequencies are non-overlapping frequency bands.

4. The method of claim 3, wherein a spectrum of the signal is contained within the first band of frequencies.

5. The method of claim 1, further comprising:
filtering the time quantization error and summing the candidate sampling time with the filtered time quantization error;
determining a second sampling time of the signal based on the sum of the candidate sampling time and the filtered time quantization error.

6. The method of claim 1, wherein the candidate sampling time of the signal comprises a time of a zero-crossing of the signal.

7. The method of claim 1, wherein the candidate sampling time of the signal comprises a time the signal changes from a first value to a second value.

8. The method of claim 1, wherein the candidate sampling time of the signal comprises a time of a rising edge or a falling edge of the signal.

9. The method of claim 1, wherein the sampling circuit selects a gridpoint of the predefined quantization grid that is closest in time to the candidate sampling time as the resultant sampling time.

10. The method of claim 1, wherein the candidate sampling time comprises an ideal sampling time of the sampling circuit.

11. The method of claim 10, wherein the quantization error comprises a time delay error introduced by the sampling circuit to the ideal sampling time.

12. A device for determining a sampling time of a signal, the device comprising:
a candidate sampling time determiner configured to determine a candidate sampling time of a signal for input to a sampling circuit;
a resultant sampling time determiner configured to determine a resultant sampling time at which the sampling circuit maps the candidate sampling time with a predefined quantization grid; and
a sampling time determiner configured to determine a sampling time of the signal based on a noise shaping of a time quantization error between the resultant sampling time and the candidate sampling time.

13. The device of claim 12, further comprising a noise shaper configured to noise shape the time quantization error, wherein the noise shaper comprises a filter configured to shape a spectrum of the time quantization error.

14. The device of claim 13, wherein the filter is configured to shift the spectrum of the time quantization error to a predetermined band of frequencies, wherein the predetermined band of frequencies and a spectrum of the signal are in non-overlapping frequency bands.

15. A method for determining sampling times of a signal, the method comprising:
determining an ideal sampling time of a signal;
mapping the ideal sampling time to a predefined quantization grid to determine a first resultant sampling time;
determining a time quantization error as a difference in time between the ideal sampling time and the resultant sampling time; and
determining a second resultant sampling time by applying noise shaping to the signal with the time quantization error.

16. The method of claim 15, wherein mapping the ideal sampling time to the predefined quantization grid to determine the first resultant sampling time comprises selecting a gridpoint of the predefined quantization grid that is closest in time to the ideal sampling time as the first resultant sampling time.

17. The method of claim 16, wherein the time quantization error is the distance in time between the gridpoint of the predefined quantization grid and the ideal sampling time.

18. The method of 15, further comprising generating an output signal with the first resultant sampling time and the second resultant sampling time.

19. The method of claim 18, wherein the output signal comprises an edge at one or more of the first resultant sampling time and the second resultant sampling time.

20. The method of claim 15, wherein determining the second resultant sampling time by applying noise shaping to the signal with the time quantization error comprises:
filtering the time quantization error and adding the filtered time quantization error to a second ideal sampling time; and
selecting the second resultant sampling time from the predefined quantization grid based on the sum of the filtered time quantization error and the second ideal sampling time.

* * * * *